United States Patent
Wang et al.

(10) Patent No.: US 9,159,881 B2
(45) Date of Patent: Oct. 13, 2015

(54) LIGHT-EMITTING DEVICE

(75) Inventors: Jia-Kuen Wang, Hsinchu (TW);
Chien-Fu Shen, Hsinchu (TW);
Chao-Hsing Chen, Hsinchu (TW);
Yu-Chen Yang, Hsinchu (TW);
Hui-Chun Yeh, Hsinchu (TW); Yi-Wen Ku, Hsinchu (TW); Hung-Che Chen, Hsinchu (TW); Chih-Nan Lin, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 21 days.

(21) Appl. No.: 13/596,528

(22) Filed: Aug. 28, 2012

(65) Prior Publication Data
US 2013/0049051 A1 Feb. 28, 2013

(30) Foreign Application Priority Data
Aug. 30, 2011 (TW) .............................. 100131198 A

(51) Int. Cl.
*H01L 33/38* (2010.01)
*H01L 33/42* (2010.01)
*H01L 33/10* (2010.01)
*H01L 33/40* (2010.01)
*H01L 33/44* (2010.01)

(52) U.S. Cl.
CPC ............ *H01L 33/405* (2013.01); *H01L 33/385* (2013.01); *H01L 33/42* (2013.01); *H01L 33/44* (2013.01)

(58) Field of Classification Search
None
See application file for complete search history.

(56) References Cited

U.S. PATENT DOCUMENTS

| | | | |
|---|---|---|---|
| 7,384,808 B2 | 6/2008 | Liu et al. | |
| 2006/0081868 A1* | 4/2006 | Kotani | 257/99 |
| 2007/0034857 A1* | 2/2007 | Song | 257/13 |
| 2008/0093617 A1* | 4/2008 | Song et al. | 257/98 |
| 2009/0121241 A1 | 5/2009 | Keller et al. | |
| 2009/0194779 A1* | 8/2009 | Yoon | 257/98 |
| 2010/0123166 A1* | 5/2010 | Bae | 257/103 |
| 2010/0320491 A1* | 12/2010 | Han | 257/98 |

FOREIGN PATENT DOCUMENTS

JP 2002-76306 A 3/2002

\* cited by examiner

*Primary Examiner* — Zandra Smith
*Assistant Examiner* — Molly Reida
(74) *Attorney, Agent, or Firm* — Ditthavong & Steiner, P.C.

(57) ABSTRACT

Disclosed is a light-emitting device comprising: a semiconductor stack layer; a reflective layer on the semiconductor stack layer; a first buffer layer comprising a compound comprising a metallic element and a non-metallic element on the reflective layer; a first electrode; and an electrical insulating layer disposed between the first buffer layer and the first electrode.

13 Claims, 5 Drawing Sheets

LIGHT-EMITTING DEVICE

TECHNICAL FIELD

The application relates to a light-emitting device, and more particular to a light-emitting device with an improved characteristics and performance.

CROSS REFERENCE TO RELATED APPLICATION

This application claims priority to Taiwan Patent Document No. 100131198, filed on Aug. 30, 2011 with the Taiwan Patent Office, which disclosure in its entirety is hereby incorporated by reference.

DESCRIPTION OF BACKGROUND ART

As shown in FIG. 1, to increase the reflection of light in a flip-chip light-emitting device (LED), a metal reflective layer (mirror) 130 is disposed on a second semiconductor layer 123 (for example, a p-type semiconductor layer). And in order to increase the bonding area in a flip-chip bonding, the first electrode 150 which is electrically connected to the first semiconductor layer 121 (for example, an n-type semiconductor layer) comprises an extending part 150b which extends to the ambient area, as shown in FIG. 1, in addition to the contact part 150a which contacts with the first semiconductor layer 121. Therefore, for electrical isolation, it is necessary that an electrical insulating layer 140 is disposed between the metal reflective layer 130 and the extending part 150b of the first electrode 150 which is electrically connected to the first semiconductor layer 121. To improve the electrical characteristics, a heat treatment process (such as anneal) to the metal reflective layer 130 is necessary to achieve a better ohmic contact. After the heat treatment process, the ohmic contact between the metal reflective layer 130 and the second semiconductor layer 123 below becomes better, and the forward voltage $V_f$ of the device can be lowered. However, after heat treatment, because the metal is oxidized and its property changed, and the adhesion to a subsequent material is reduced, a poor adhesion exists between the metal reflective layer 130 and an electrical insulating layer 140 subsequently covered thereon, and results in the peeling of the electrical insulating layer 140 (and layers formed thereon) along with the removal of the photo-resistor in a subsequent process such as the lift-off process of the photo-resistor for forming an electrode. The actual peeling condition is shown in FIG. 5. The adhesion problem demonstrates that there is a stress existing between the electrical insulating layer 140 and the metal reflective layer 130. Due to the effect of the stress, in a high temperature process, a poor contact occurs at the interface of the metal reflective layer 130 and the second semiconductor layer 123, and leads to the rising of the forward voltage $V_f$ and the increasing of the current leakage.

SUMMARY OF THE DISCLOSURE

Disclosed is a light-emitting device comprising: a semiconductor stack layer; a reflective layer on the semiconductor stack layer; a first buffer layer comprising a compound comprising a metallic element and a non-metallic element on the reflective layer; a first electrode; and an electrical insulating layer disposed between the first buffer layer and the first electrode.

DETAILED DESCRIPTION OF PREFERRED EMBODIMENTS

Figure 1:
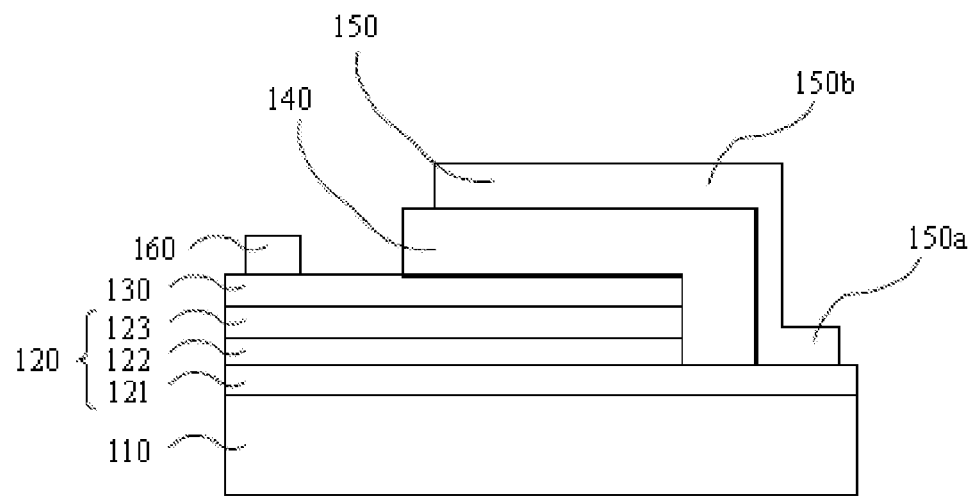
FIG. 1 illustrates a conventional light-emitting device.

To improve the aforementioned adhesion problem existing between the metal reflective layer 130 and the electrical insulating layer 140 in a light-emitting device illustrated in FIG. 1, and to avoid and improve the stress problem existing between the metal reflective layer 130 and the electrical insulating layer 140 in the light-emitting device in a subsequent high temperature process, in one of the embodiments of the application, a first buffer layer is provided between the metal reflective layer and the electrical insulating layer. The first buffer layer comprises a compound comprising a metallic element and a non-metallic element, such as a metallic oxide or a metallic nitride, as a stress buffer between the metal reflective layer and the electrical insulating layer. In one embodiment, indium tin oxide (ITO) is used as this first buffer layer.

Figure 2:
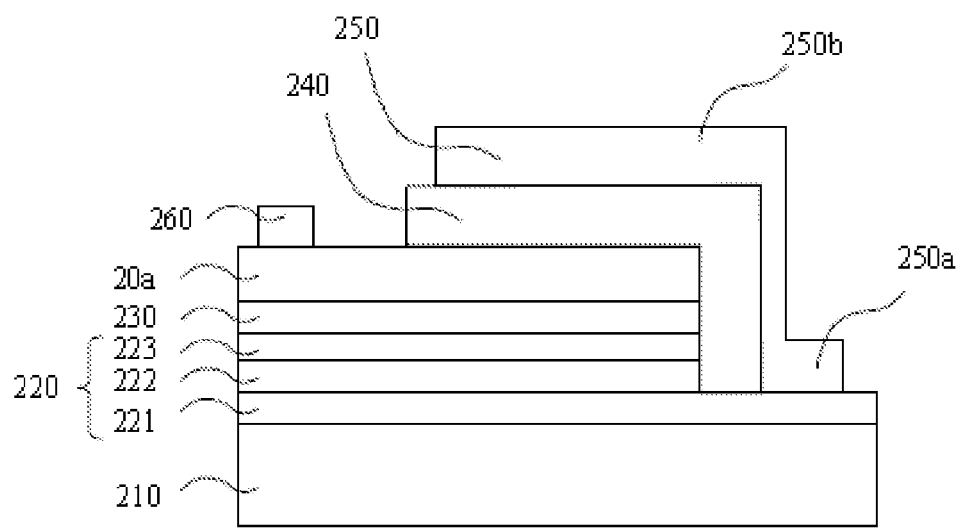
FIG. 2 illustrates a light-emitting device in accordance with the first embodiment of the present application.

This first embodiment of the structure of the light-emitting diode comprising the first buffer layer is shown in FIG. 2. The light emitting diode comprises a growth substrate 210 and a semiconductor stack layer 220 on the growth substrate 210. The semiconductor stack layer 220 comprises a first conductivity type semiconductor layer 221; an active layer 222 on the first conductivity type semiconductor layer 221; and a second conductivity type semiconductor layer 223 on the active layer 222. The first conductivity type semiconductor layer 221 and the second conductivity type semiconductor layer 223 have different conductivity type, for example, in this embodiment the first conductivity type semiconductor layer 221 is an n-type semiconductor layer and the second conductivity type semiconductor layer 223 is a p-type semiconductor layer. A metal reflective layer 230 is disposed on the semiconductor stack layer 220; a first buffer layer 20a is disposed on the metal reflective layer 230. The first buffer layer 20a comprises a compound comprising a metallic element and a non-metallic element, such as a metallic oxide or a metallic nitride, as a stress buffer between the metal reflective layer 230 and an electrical insulating layer 240 which is formed subsequently. The electrical insulating layer 240 is disposed on the first buffer layer 20a to function as an electrical insulating between the metal reflective layer 230 and a first electrode 250 which is formed later. The first electrode 250 is disposed on the electrical insulating layer 240. And in order to be electrically connected to the first conductivity type semiconductor layer 221 and to increase the bonding area in a flip-chip bonding, the first electrode 250 comprises a contact part 250a which contacts with the first conductivity type semiconductor layer 221 and an extending part 250b which extends along the sidewall of the semiconductor stack layer 220 and onto the electrical insulating layer 240. Therefore, in addition to being disposed on the first buffer layer 20a, the electrical insulating layer 240 is disposed along the sidewall of the semiconductor stack layer 220 to provide an electrical isolation from the first electrode 250 which extends along the sidewall of the semiconductor stack layer 220. In other words, with the contact part 250a, the first electrode 250 is electrically connected to the area of the mesa structure (i.e., the area where the second conductivity type semiconductor layer 223 and the active layer 222 are removed and the first conductivity type semiconductor layer 221 is exposed) of the first conductivity type semiconductor layer 221 of the semiconductor stack layer 220, and the extending part 250b of the first electrode 250 extends along the sidewall of the mesa structure and onto the electrical insulating layer 240. In addition to being disposed on the first buffer layer 20a, along with the first electrode 250, the electrical insulating layer 240 extends along the sidewall of the mesa structure to the area of the mesa structure, and contact with the first conductivity type semiconductor layer 221 to provide an electrical insulating function. In addition, the light-emitting diode further comprises a second electrode 260 which is disposed on the first buffer layer 20a and electrically connected to the second conductivity type semiconductor layer 223 through the first buffer layer 20a and the metal reflective layer 230. The type of light-emitting diode structure as shown in FIG. 2 is named "capped structure".

The material of the metal reflective layer 230 comprises metal such as aluminum, gold, platinum, zinc, silver, nickel, germanium, indium, and tin, or an alloy thereof. The material of the electrical insulating layer 240 comprises a non-conductive material such as aluminum oxide, titanium dioxide, silicon oxide, silicon nitride, and aluminum nitride or a combination thereof. The material of the first electrode 250 and the second electrode 260 comprises metal such as gold, silver, aluminum, copper, platinum, tin, nickel, germanium, titanium, palladium, and chromium, or an alloy thereof. The materials of the growth substrate 210 and the semiconductor stack layer 220 are well known by persons of skill in the art, and are not illustrated here.

The first buffer layer 20a comprises a compound comprising a metallic element and a non-metallic element, such as a metallic oxide or a metallic nitride, as a stress buffer between the metal reflective layer and the electrical insulating layer. In one embodiment, indium tin oxide (ITO) is used as this first buffer layer. The metallic oxide comprises $In_2O_3$, $SnO_2$, ZnO, $TiO_2$, or CdO. The metal oxide may also comprise a doped metallic oxide such as $In_2O_3$:Sn (ITO), $In_2O_3$:Mo (IMO), ZnO:In (IZO), ZnO:Ga (GZO), ZnO:Al (AZO), $SnO_2$:F, or $TiO_2$:Ta. Or the metal oxide may also comprise a mixture of two materials selected from the group of metallic oxide materials illustrated above and the group of materials of the doped metallic oxide illustrated above, for example, $In_2O_3$—ZnO (IZO) (It is noted that sometimes both $In_2O_3$—ZnO and the aforementioned ZnO:In are named IZO by persons of skill in the art, but they are different in the composition of In. For ZnO:In, In is slightly doped, and for $In_2O_3$—ZnO, the content of In is close to that of Zn.), $In_2O_3$—ZnO:Ga (IGZO), $In_2O_3$—$TiO_2$ (MO), CdO—$In_2O_3$($CdIn_2O_4$, CIO), CdO—$SnO_2$($Cd_2SnO_4$, CTO), and ZnO—$SnO_2$($Zn_2SnO_4$, ZTO). The metallic nitride comprises TiN, MN, TaN, CrN, ZrN, VN, or NbN. The metal nitride may also comprise a mixture of two metallic nitrides, for example, TiN—AlN (TiAlN) or TiN—CN (TiCN). The aforementioned first buffer layer 20a may be formed by electron beam (E-beam) evaporation, ion-sputtering, thermal evaporation, Molecular Beam Epitaxy (MBE), Metal Organic Chemical Vapor Deposition (MOCVD), low pressure chemical vapor deposition (a low pressure CVD, LPCVD), plasma enhanced chemical vapor deposition (plasma enhanced CVD, PECVD), or a combination of the above methods.

Figure 3:
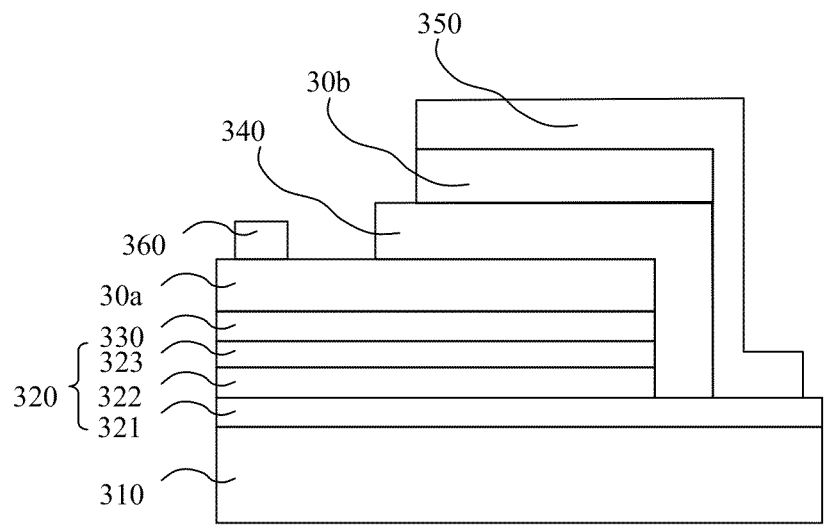
FIG. 3 illustrates a light-emitting device in accordance with the second embodiment of the present application.

The second embodiment of the present application is shown in FIG. 3. FIG. 3 and FIG. 2 are substantially similar, and the main difference is a stress buffer layer, i.e., the second buffer layer 30b, is also provided between the electrical insulating layer 340 (corresponding to the electric insulating layer 240 in FIG. 2) and the first electrode 350 (corresponding to the first electrode 250 in FIG. 2). In other words, in this embodiment, in addition to the first buffer layer 30a between the metal reflective layer 330 and the later-formed electrical insulating layer 340 to function as a stress buffer layer, there exists further the second buffer layer 30b between the electrical insulating layer 340 and the first electrode 350. The second buffer layer 30b can prevent the peeling problem resulting from the poor adhesion between the electrical insulating layer 340 and the metal reflective layer 330. The material and the forming method of the second buffer layer 30b (and the first buffer layer 30a) are the same as those of the buffer layer 20a shown in FIG. 2, and are not illustrated again here. A layer in FIG. 3 corresponds to a layer in FIG. 2 when they are labeled with identical last two digits, and is not illustrated again here. The type of light-emitting diode structure as shown in FIG. 3 is named "sandwich structure".

Figure 4:
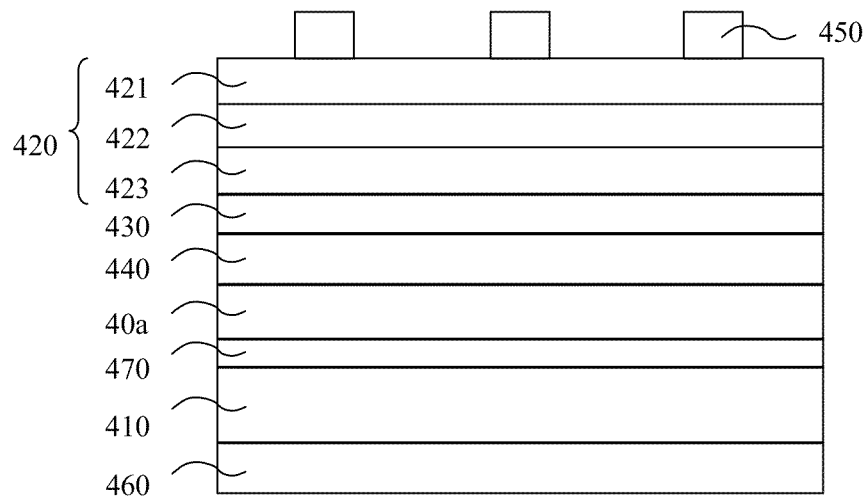
FIG. 4 illustrates a light-emitting device in accordance with the third embodiment of the present application.

FIG. 4 shows the light-emitting diode structure of the third embodiment of the present application, which comprises a conductive substrate 410; a metal bonding layer 470 on the conductive substrate 410; a buffer layer 40a on the metal bonding layer 470, which comprises a compound comprising a metallic element and a non-metallic element; a diffusion barrier layer 440 on the buffer layer 40a; a metal reflective layer 430 on the diffusion barrier layer 440; and a light-emitting stack layer 420 on the metal reflective layer 430. With regard to the process, the light-emitting diode structure may be accomplished through a bonding process. That is, first, a growth substrate (not shown) is provided, and the light-emitting stack layer 420, the metal reflective layer 430, the diffusion barrier layer 440, the buffer layer 40a, and the metal bonding layer 470 are formed thereon in order, wherein the light-emitting stack layer 420 is formed by the sequential formation of a first conductivity type semiconductor layer 421, an active layer 422, and a second conductivity type semiconductor layer 423. The first conductivity type semiconductor layer 421 and the second conductivity type semiconductor layer 423 are of different conductivity type, for example, in this embodiment the first conductivity type semiconductor layer 421 is an n-type semiconductor layer and the second conductivity type semiconductor layer 423 is a p-type semiconductor layer. And then, the metal bonding layer 470 is bonded to the aforementioned conductive substrate 410 through the bonding process. In addition, a first electrode 450 is disposed on the light-emitting stack layer 420 and is electrically connected to the first conductivity type semiconductor layer 421, and a second electrode 460 is formed and is electrically connected to the conductive substrate 410.

The material of the metal reflective layer 430 comprises metal such as aluminum, gold, platinum, zinc, silver, nickel, germanium, indium, and tin, or an alloy thereof. The material of the diffusion barrier layer 440 comprises metal such as nickel, copper, platinum, titanium, tungsten, niobium, tantalum, and palladium, an alloy thereof. The material of the metal bonding layer 470 comprises metal such as aluminum, gold, platinum, zinc, silver, nickel, germanium, indium, tin, titanium, lead, copper, and palladium, or an alloy thereof. The material of the first electrode 450 and the second electrode 460 comprises metal such as gold, silver, aluminum, copper, platinum, tin, nickel, germanium, titanium, palladium, and chromium, or an alloy thereof. The materials of the conductive substrate 410 and the light-emitting stack layer 420 are well known by persons of skill in the art, and are not illustrated here. The material and the forming method of the buffer layer 40a are the same as those of the first buffer layer 20a shown in FIG. 2, and are not illustrated again here.

In the vertical type light-emitting diode such as the structure of this embodiment, in order to strengthen the bonding condition at the interface of the metal reflective layer 430 and the light-emitting stack layer 420 (or specifically the second conductivity type semiconductor layer 423) to reduce the forward voltage $V_f$ of the light-emitting diode, a heat treatment process is usually performed subsequently. As mentioned above, however, the heat treatment process results in a stress between the different metal materials, such as the stress between the diffusion barrier layer 440 and the metal bonding layer 470, which causes a substantial increase of the forward voltage $V_f$. So in this embodiment, the buffer layer 40a is provided between these two layers to function as a stress buffer layer, and increase the thermal stability of the device. The improvement and benefit is shown in the following.

Figure 5:
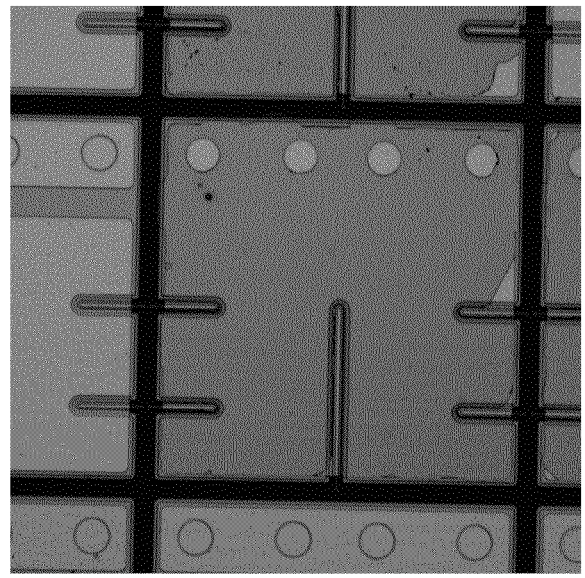
FIG. 5 shows the microscope image for the light-emitting diode of the structure shown in FIG. 1 in the manufacturing process.
Figure 6:
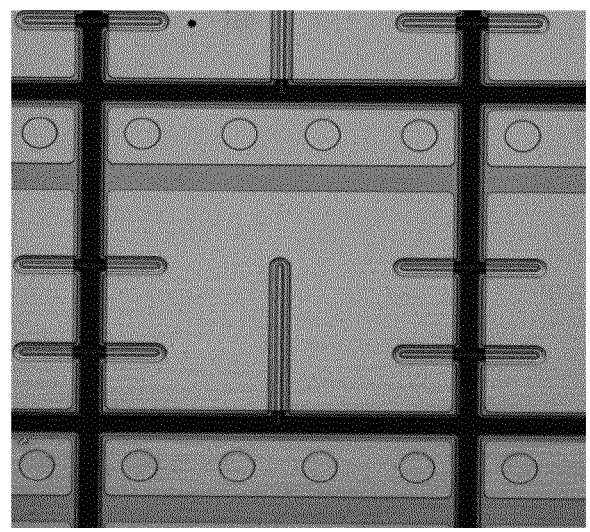
FIG. 6 shows the microscope image for the light-emitting diode of the structure shown in FIG. 2 in the manufacturing process.
Figure 7:
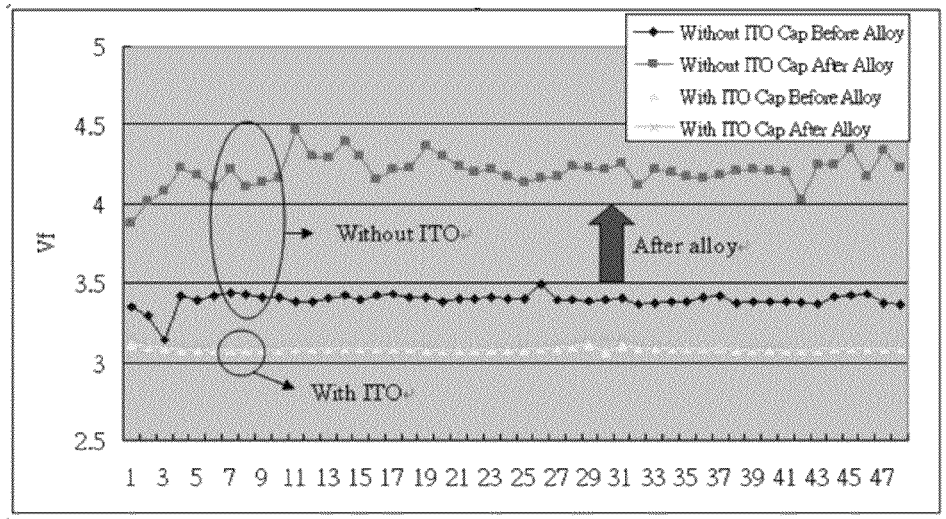
FIG. 7 shows a chart showing a comparison of the electrical characteristics of the light-emitting diodes corresponding to the light-emitting diodes illustrated in FIG. 5 and FIG. 6 before and after a heat treatment for alloying.

As mentioned above, FIG. 5 is the microscope image for the light-emitting diode of the structure shown in FIG. 1 in the manufacturing process. Because there is no the aforementioned buffer layer structure, peeling occurs in subsequent process. In contrast, FIG. 6 is the microscope image for the light-emitting diode of the structure shown in FIG. 2. (i.e., the "capped structure"), which adopts ITO as the first buffer layer 20a, and there is no peeling. It can be seen that the buffer layer can effectively improve the adhesion between the metal and insulation layer. FIG. 7 is a chart which shows a comparison of the electrical characteristics of the light-emitting diodes corresponding to the light-emitting diodes illustrated in FIG. 5 and FIG. 6 before and after a 270° C., 10 minutes heat treatment for alloying. It can be clearly seen that in contrast to the light-emitting diode of the structure shown in FIG. 1, the light-emitting diode structure disclosed in this embodiment can effectively prevent the problem of the great increase of the forward voltage $V_f$ caused by the stress resulting from the heat treatment for alloying, and effectively promote the thermal stability of the device.

Figure 8:
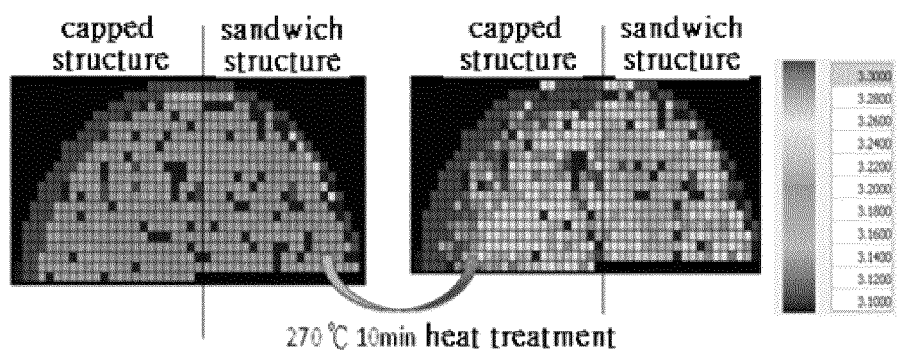
FIG. 8 shows the mapping of the forward voltage $V_f$ testing result of the light-emitting diodes having the structure shown in FIG. 2 and FIG. 3 before and after a heat treatment for alloying.
Figure 9:
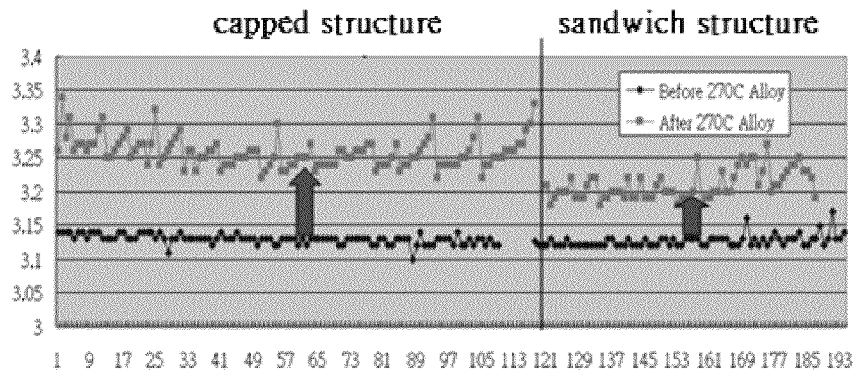
FIG. 9 shows the numerical data of FIG. 8.

FIG. 8 shows the mapping of the forward voltage $V_f$ testing result of the light-emitting diodes (wherein ITO is used as the first buffer layer 20a, 30a and the second buffer layer 30b) of the structure shown in FIG. 2 (i.e., the "capped structure") and FIG. 3 (i.e., the "sandwich structure"), before and after a 270° C., 10 minutes heat treatment for alloying. It can be clearly seen that the light-emitting diode having the structure shown in FIG. 3 is more effective than the light-emitting diode having the structure shown in FIG. 2 in promoting the thermal stability of the device. The numerical data of the forward voltage $V_f$ (vertical axis) are shown in FIG. 9.

Figure 10:
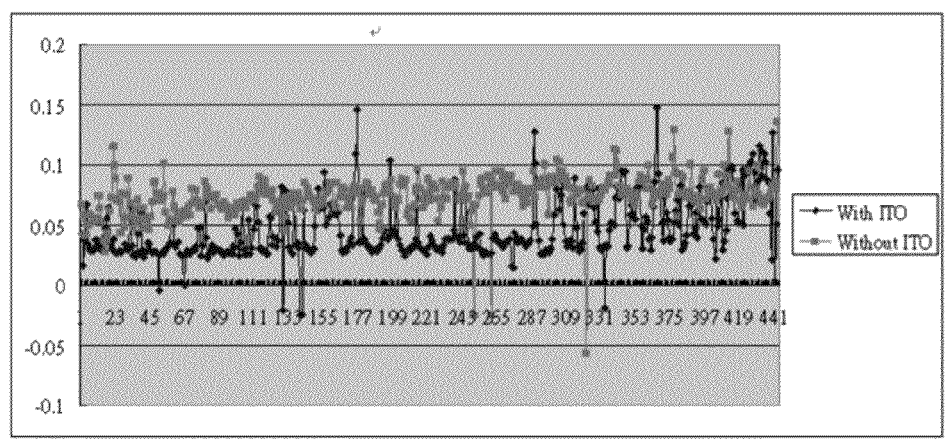
FIG. 10 shows the change of the forward voltage $V_f$ for the light-emitting diodes having the structure shown in FIG. 4 and the light-emitting diodes having the same structure but not having a buffer layer before and after a heat treatment for alloying.

FIG. 10 shows the change of the forward voltage $V_f$ (delta $V_f$, vertical axis) of the light-emitting diodes (wherein ITO is used as the buffer layer 40a) of the structure shown in FIG. 4 and the light-emitting diodes having the same structure without buffer layer 40a before and after a 270° C., 10 minutes heat treatment for alloying. The change of the forward voltage $V_f$ (delta $V_f$) of the light-emitting diode of the structure shown in FIG. 4 is about 0.05V lower comparatively. This shows that the buffer layer can reduce the stress between the metal layers so that the device has a better thermal stability.

The above-mentioned embodiments are only examples to illustrate the theory of the present invention and its effect, rather than be used to limit the present invention. Other alternatives and modifications may be made by a person of ordinary skill in the art of the present application without escaping the spirit and scope of the application, and are within the scope of the present application.

What is claimed is:

1. A light-emitting device, comprising:
a semiconductor stack layer;
a reflective layer on the semiconductor stack layer;
a first buffer layer comprising a compound comprising a metallic element and a non-metallic element on the reflective layer;
a first electrode extending along a sidewall and a top of the semiconductor stack layer; and
an electrical insulating layer extending along a sidewall and a top of the semiconductor stack layer and in direct contact with the first buffer layer and completely separating the first buffer layer from contacting with the first electrode.

2. The light-emitting device as claimed in claim 1, further comprising a second buffer layer comprising a compound comprising a metallic element and a non-metallic element between the electrical insulating layer and the first electrode.

3. The light-emitting device as claimed in claim 1, wherein the first buffer layer comprises a metallic oxide or a metallic nitride.

4. The light-emitting device as claimed in claim 2, wherein the second buffer layer comprises a metallic oxide or a metallic nitride.

5. The light-emitting device as claimed in claim 3, wherein the metallic oxide comprises a doped metallic oxide, and/or the metallic nitride comprises a mixture of two metallic nitride materials.

6. The light-emitting device as claimed in claim 4, wherein the metallic oxide comprises a doped metallic oxide, and/or the metallic nitride comprises a mixture of two metallic nitride materials.

7. The light-emitting device as claimed in claim 6, wherein the doped metallic oxide comprises $In_2O_3$:Sn (ITO), $In_2O_3$:Mo (IMO), ZnO:In (IZO), ZnO:Ga (GZO), ZnO:Al (AZO), $SnO_2$:F, or $TiO_2$:Ta.

8. The light-emitting device as claimed in claim 1, wherein the first buffer layer comprises a mixture of two metallic oxide materials, a mixture of a metallic oxide and a doped metallic oxide, or a mixture of two doped metallic oxide materials.

9. The light-emitting device as claimed in claim 1, wherein the first buffer layer comprises $In_2O_3$-ZnO (IZO), $In_2O_3$-ZnO: Ga (IGZO), $In_2O_3$-$TiO_2$ (ITiO), CdO—$In_2O_3$ ($CdIn_2O_4$, CIO), CdO—$SnO_2$($Cd_2SnO_4$, CTO), ZnO—$SnO_2$($Zn_2SnO_4$, ZTO).

10. The light-emitting device as claimed in claim 1, further comprising a second electrode on the first buffer layer, wherein the area of the first electrode is larger than that of the second electrode.

11. The light-emitting device as claimed in claim 1, further comprising a carrier board, and the first electrode and the second electrode of the light-emitting device are flip-chip bonded to the carrier board.

12. The light-emitting device as claimed in claim 1, wherein the semiconductor stack layer comprises a first conductivity type semiconductor layer; an active layer on the first conductivity type semiconductor layer; and a second conductivity type semiconductor layer on the active layer.

13. The light-emitting device as claimed in claim 12, wherein the semiconductor stack layer comprises a first area where the second conductivity type semiconductor layer and the active layer are removed to form a mesa structure, and the first electrode extends along the sidewall of the mesa structure toward the first area and contacts with the first conductivity type semiconductor layer, and the electrical insulating layer extends along the sidewall of the mesa structure toward the first area and contacts with the first conductivity type semiconductor layer.

* * * * *